(12) United States Patent
Langdon et al.

(10) Patent No.: US 8,508,001 B2
(45) Date of Patent: Aug. 13, 2013

(54) SEMICONDUCTOR DEVICE WITH WORK FUNCTION ADJUSTING LAYER HAVING VARIED THICKNESS IN A GATE WIDTH DIRECTION AND METHODS OF MAKING SAME

(75) Inventors: Steven Langdon, Dresden (DE); Stefan Flachowsky, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/217,792

(22) Filed: Aug. 25, 2011

(65) Prior Publication Data

US 2013/0049139 A1 Feb. 28, 2013

(51) Int. Cl.
  *H01L 29/45* (2006.01)
  *H01L 29/49* (2006.01)
  *H01L 29/78* (2006.01)
  *H01L 27/14* (2006.01)
  *H01L 27/12* (2006.01)

(52) U.S. Cl.
  USPC ........... 257/402; 257/407; 257/213; 257/214; 438/142; 438/149; 438/300

(58) Field of Classification Search
  None
  See application file for complete search history.

(56) References Cited

U.S. PATENT DOCUMENTS

| | | | |
|---|---|---|---|
| 4,203,799 A | 5/1980 | Sugawara et al. | |
| 5,256,898 A | 10/1993 | Suda | |
| 6,727,567 B2 | 4/2004 | Bastek et al. | |
| 7,105,399 B1 | 9/2006 | Dakshina-Murthy et al. | |
| 7,402,207 B1 | 7/2008 | Besser et al. | |
| 7,601,215 B1 | 10/2009 | Wang et al. | |
| 2009/0258463 A1 | 10/2009 | Kim et al. | |
| 2010/0151648 A1* | 6/2010 | Yu et al. | 438/300 |
| 2010/0193881 A1 | 8/2010 | Kronholz et al. | |
| 2012/0119266 A1* | 5/2012 | Guo et al. | 257/288 |

* cited by examiner

*Primary Examiner* — Julio J Maldonado
*Assistant Examiner* — Moin Rahman
(74) *Attorney, Agent, or Firm* — Williams, Morgan & Amerson, P.C.

(57) ABSTRACT

Disclosed herein is a semiconductor device that includes a semiconducting substrate and a work-function adjusting layer positioned at least partially in the semiconducting substrate, the work-function adjusting layer having a middle section, opposing ends and an end region located proximate each of said opposing ends and a gate electrode positioned above the work-function adjusting layer. Each of the end regions has a maximum thickness that is at least 25% greater than an average thickness of the middle section of the work-function adjusting layer.

16 Claims, 3 Drawing Sheets

SEMICONDUCTOR DEVICE WITH WORK FUNCTION ADJUSTING LAYER HAVING VARIED THICKNESS IN A GATE WIDTH DIRECTION AND METHODS OF MAKING SAME

BACKGROUND OF THE INVENTION

1. Field of the Invention

Generally, the present disclosure generally relates to the manufacturing of sophisticated semiconductor devices, and, more specifically, to a semiconductor device, such as an illustrative PMOS transistor, with a work function adjusting layer that has a thickness that varies in the gate width direction, and various methods of making such a device.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

FIG. 1A depicts an illustrative prior art device 100 that is generally comprised of a partially formed NMOS transistor 100N and a partially formed PMOS transistor 100P formed in and above a semiconducting substrate 10. The illustrative transistors 100N, 100P are separated by an illustrative isolation structure 12, e.g., a shallow trench isolation structure, formed in the substrate 10. In one illustrative embodiment, the semiconducting substrate 10 is comprised of silicon. The substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration.

At the stage of manufacture depicted in FIG. 1A, the transistors 100N, 100P are each comprised of a gate structure 20 and source/drain regions 30. The gate structure 20 may include a gate insulation layer 22, a high-k insulation layer 24, a gate electrode 26 and sidewall spacers 28. The gate electrode 26 may be made of a variety of materials, such as lanthanum (for the NMOS transistor 100N) and aluminum (for the PMOS transistor 100P). In some cases, the PMOS transistor 100P may have an additional work function layer 25, such as titanium nitride, that may not be present in the NMOS transistor 100N. Typically, during the formation of the PMOS transistor 100P, a work function adjusting layer 32, such as a layer of epitaxial silicon germanium, is selectively grown on the active layer 10C in the P-active region where the PMOS transistor 100P will be formed in an attempt to control the threshold voltage of the PMOS transistor 100P, and thereby enhance the performance and controllability of the PMOS transistor 100P. Typically, the work function adjusting layer 32 is not formed for the NMOS transistor 100N. Typically, depending upon the particular application, the target thickness of the work function adjusting layer 32 may be about 100 nm. FIG. 1B is a plan view of just the PMOS transistor 100P. The transistor has a gate length direction 10L and a gate width direction 10W. Along the gate width direction 10W, the work function adjusting layer 32 has opposite ends 32A, 32B and a middle region 32M.

In a field effect transistor, the conductivity of the channel region, i.e., the drive current capability of the conductive channel is controlled by the gate electrode formed adjacent to the channel region and separated therefrom by the gate thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction 10W, the distance between the source and drain regions 30, which is also referred to as channel length. Hence, in combination with the capability of rapidly creating a conductive channel below the insulating layer 22 upon application of the control voltage to the gate electrode 26, the conductivity of the channel region substantially affects the performance of MOS transistors. Thus, as the speed of creating the channel, which depends on the conductivity of the gate electrode 26, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. In field effect transistors, silicon dioxide is typically used as a gate insulation layer 22 that separates the gate electrode 26, frequently comprised of polysilicon or other metal-containing materials, from the channel region 31. In steadily improving device performance of field effect transistors, the length of the channel region 31, the so-called "gate length," has been continuously decreased to improve the switching speed and the drive current capability of the resulting devices. Since the transistor performance is controlled by the voltage supplied to the gate electrode 26 to invert the surface of the channel region 31 to a sufficiently high charge density for providing the desired drive current for a given supply voltage, a certain degree of capacitive coupling, provided by the capacitor formed by the gate electrode 26, the channel region 31 and the insulating layers disposed there between, has to be maintained. It turns out that decreasing the channel length 31 requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage, and thus reduced threshold voltage, may suffer from an exponential increase of the leakage current due to the required enhanced capacitive coupling of the gate electrode 26 to the channel region 31 that is accomplished by decreasing the thickness of the gate insulation layer 22. For example, a channel length of approximately 0.08 µm may require a gate dielectric made of silicon dioxide as thin as approximately 1.2 nm. Although, generally, usage of high speed transistor elements having an extremely short channel length may be restricted to high-speed signal paths, whereas transistor elements with a longer channel length may be used for less critical signal paths, the relatively high leakage current caused by direct tunneling of charge carriers through an ultra-thin silicon dioxide gate insulation layer 22 may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include so-called high-k materials (k value greater than 10) that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode 26 to replace the typical polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration may be required.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., NMOS transistors 100N and PMOS transistors 100P, which may require an additional band gap offset for the PMOS transistors 100P. For this reason, as noted above, the PMOS transistor 100P usually includes a metal-containing gate electrode material, and the work function adjusting layer 32 between the high-k dielectric material 24 and the channel region 31 of the PMOS device 100P, in order to appropriately modulate the work function of the PMOS device 100P. More specifically, by including this work function adjusting layer 32, the threshold voltage of the PMOS device 100P is shifted or lowered to acceptable levels for use in modern high-performance integrated circuit devices. That is, the threshold voltage of a PMOS device 100P without such a work function adjusting layer 32 would tend to be too high for use in high-performance devices.

Another technique that device designers have employed to enhance the performance of transistor devices involves the use of channel stress engineering techniques on transistors. More specifically, designers use various techniques to create a tensile stress in the channel region 31 of the NMOS transistors 100N and to create a compressive stress in the channel region 31 of the PMOS transistors 100P. These stress conditions improve charge carrier mobility of the devices—electrons for NMOS devices 100N and holes for PMOS devices 100P. As it relates to PMOS devices 100P, the work function adjusting layer 32 typically provides a significant portion of the desired compressive stress to the channel region 31 of the device. With reference to FIG. 1B, one problem with current state of the art work function adjusting layer 32 is that the stress within the work function adjusting layer 32 tends to relax toward the opposing ends 32A, 32B of the work function adjusting layer 32 as compared to the stress of the work function adjusting layer 32 toward the middle 32M of the work function adjusting layer 32. This is especially true as gate widths get smaller. This lack of a consistent stress along the gate width direction 10W causes mobility degradation and an increase of the threshold voltage of such a device, since applying the desired compressive stress in the channel region 31 of a PMOS device 100P may, in some cases, account for almost half of the shift in the threshold voltage, e.g., 150 mV of a total 300 mV shift. Both of these problems result in less drive current and reduced device performance capabilities of the resulting PMOS device 100P and consumer electronic products incorporating such devices.

FIGS. 1C and 1D are partial cross-sectional views of illustrative examples of prior art work function adjusting layers. In FIG. 1C, the work function adjusting layer 32 may have a generally rounded profile at the edges 32A, 32B of the work function adjusting layer 32. Typically, the region 32L is a region that exhibits a relatively lower compressive stress level as compared to the illustrative region 32H, which exhibits a relatively higher compressive stress level. The thickness of the work function adjusting layer 32 depicted in FIG. 1C tends to vary along the gate width direction 10W. For example, in one illustrative example, the thickness of the work function adjusting layer 32 depicted in FIG. 1C may be approximately uniform in the middle region 32M (three readings of approximately 9.6, 9.3, and 9.4 nm from left to right in FIG. 1C) and thereafter taper off significantly at the very edges 32E of the work function adjusting layer 32. The illustrative work function adjusting layer 32 depicted in FIG. 1D tends to be somewhat flatter as compared to the one depicted in FIG. 1C. More specifically, the work function adjusting layer 32 depicted in FIG. 1D may also be approximately uniform in the middle region 32M (three readings of approximately 6.0, 5.7, and 6.0 nm from left to right in FIG. 1D) and thereafter taper off sharply at the very edges 32E of the work function adjusting layer 32.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a semiconductor device with a work function adjusting layer that has a thickness that varies in the gate width direction, and various methods of making such a device. In one example, the device includes a semiconducting substrate and a work-function adjusting layer positioned at least partially in the semiconducting substrate, the work-function adjusting layer having a middle section, opposing ends and an end region located proximate each of the opposing end and a gate electrode positioned above the work-function adjusting layer. In one illustrative example, each of the end regions has a maximum thickness that is at least 25% greater than an average thickness of the middle section of the work-function adjusting layer. In another illustrative example, each of the end regions has a maximum thickness that is at least 30-70% greater than the average thickness of the middle section of the work-function adjusting layer.

BRIEF DESCRIPTION OF THE DRAWINGS

The disclosure may be understood by reference to the following description taken in conjunction with the accompanying drawings, in which like reference numerals identify like elements, and in which.

Figure 1A:
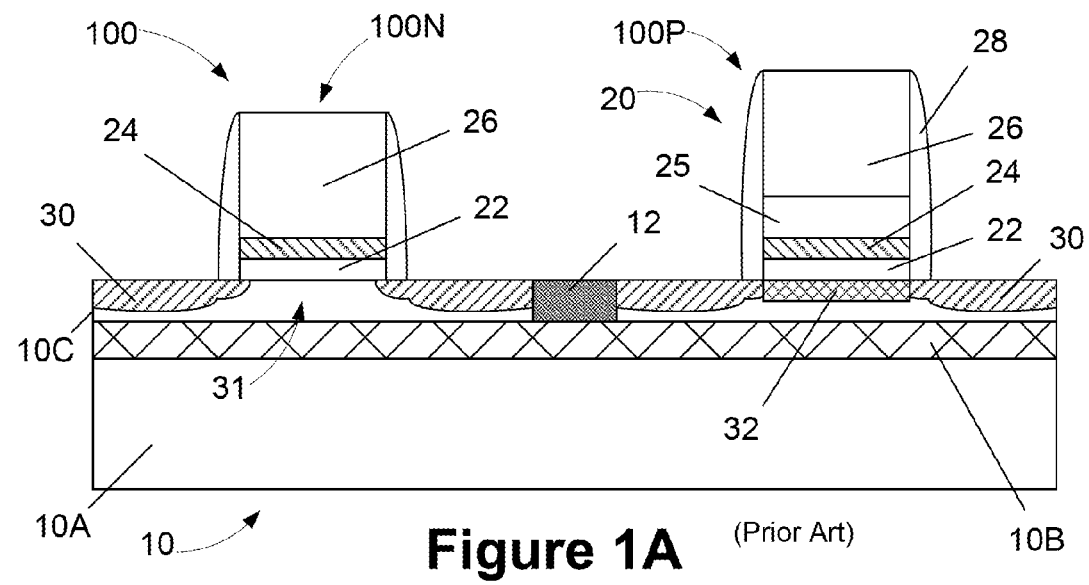
FIG. 1A-1D schematically depicts an illustrative prior art semiconductor device that includes illustrative NMOS and PMOS transistors and illustrative work function adjusting layers formed on such devices.
Figure 1B:
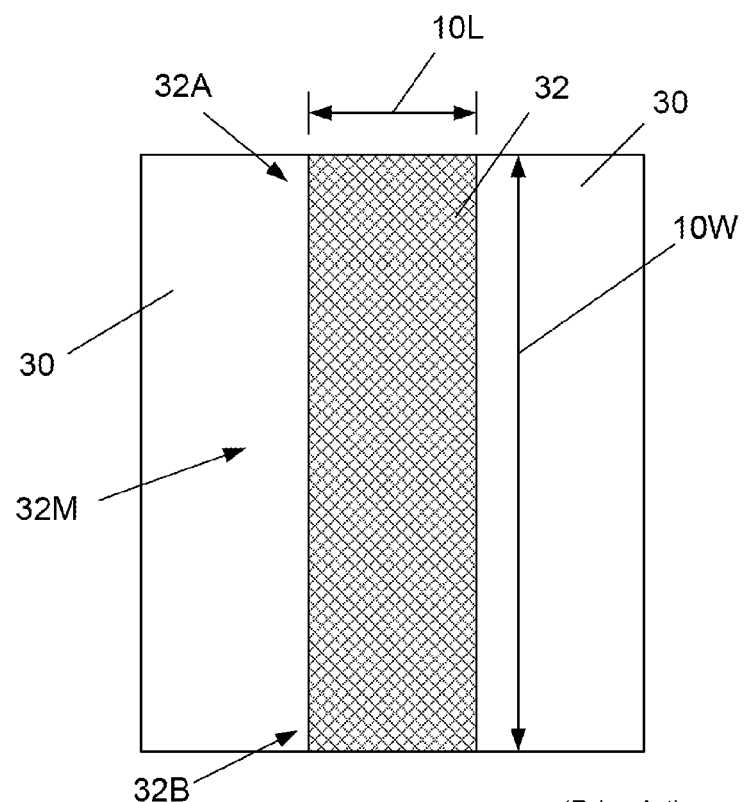
Figure 1C:
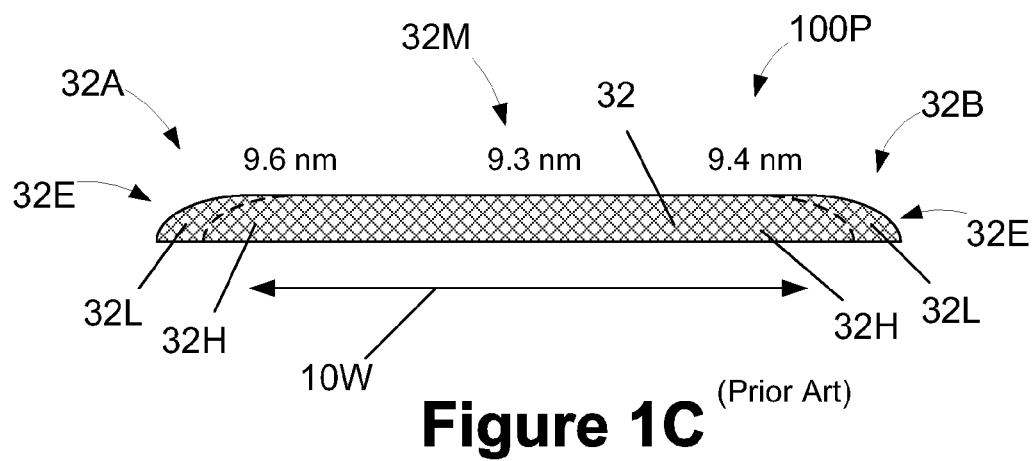
Figure 1D:
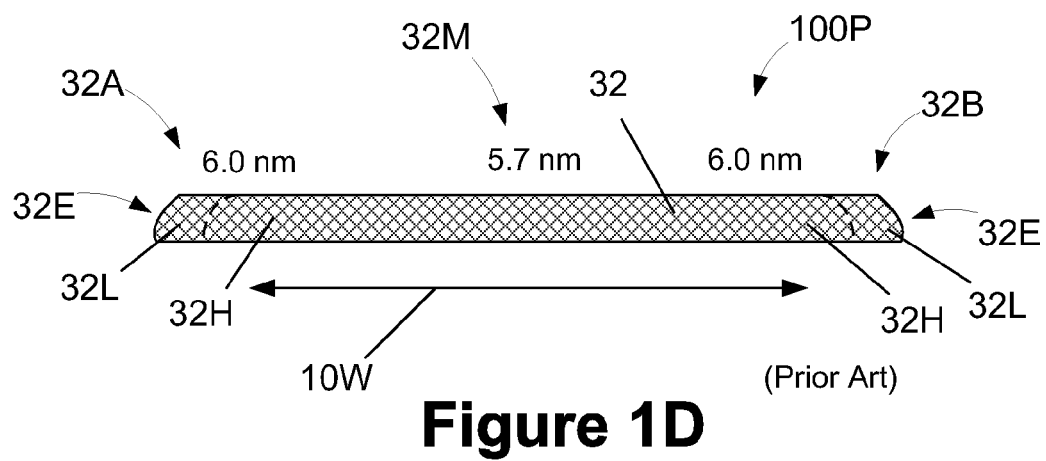

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
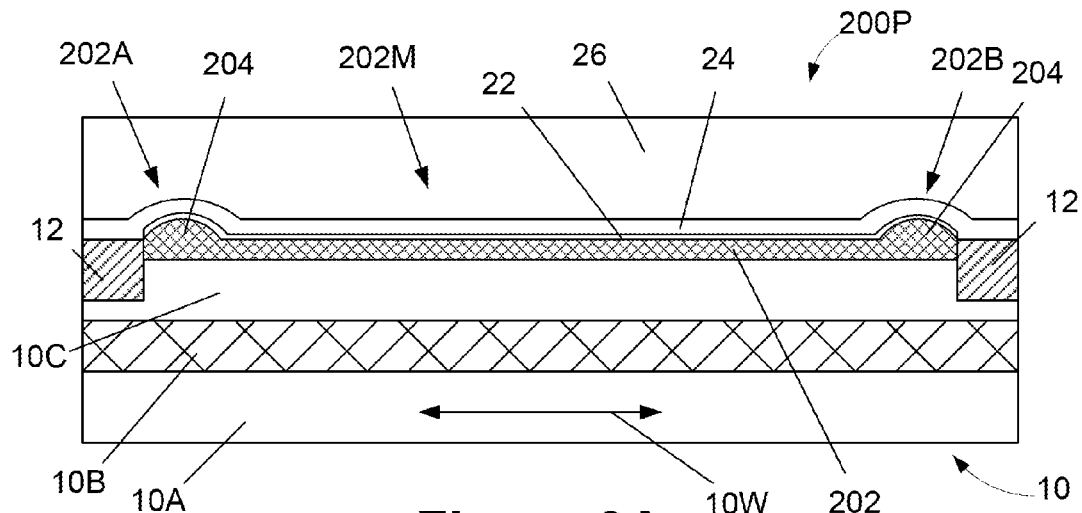
FIGS. 2A-2C depict one illustrative example of a novel device and method described herein.
Figure 2B:
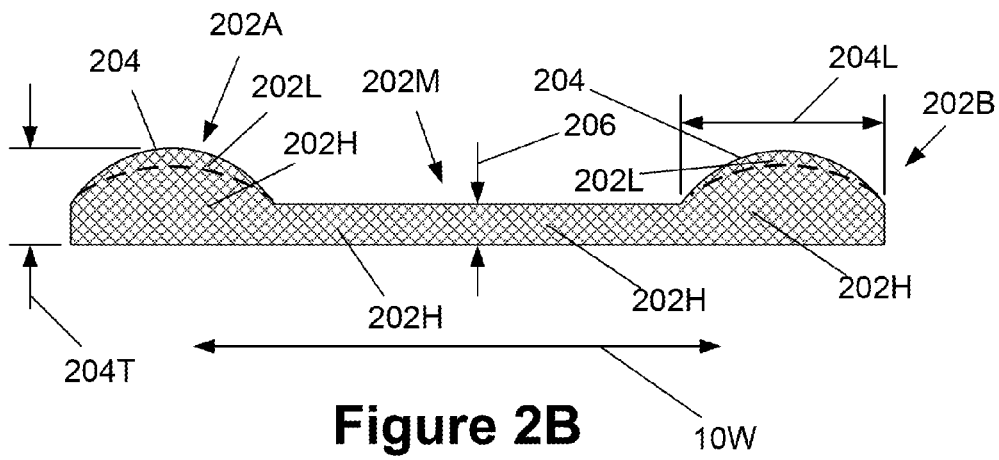
Figure 2C:
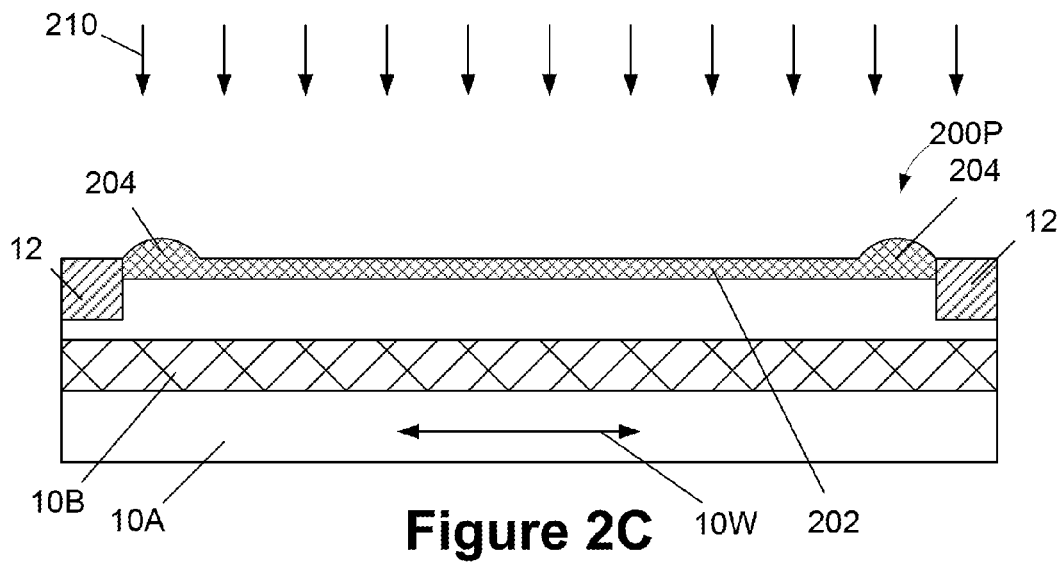

The present disclosure is directed to a semiconductor device, such as a PMOS transistor device, with a work function adjusting layer that has a thickness that varies in the gate width direction, and various methods of making such a device. As will be readily apparent to those skilled in the art upon a complete reading of the present application, the present method is applicable to a variety of technologies, and is readily applicable to a variety of devices, including, but not limited to, logic devices, memory devices, ASICs, etc. With reference to FIGS. 2A-2C, further illustrative embodiments will now be described in more detail, wherein reference may also be made to FIG. 1A-1D, if required. To the extent that both sets of figures include the same reference number, it should be understood that such reference refers to the same or similar materials and/or structures.

FIG. 2A is a cross-sectional view, along the gate width 10W direction, of an illustrative semiconductor device 200P, such as a PMOS transistor, made in accordance with one illustrative process flow described herein. The semiconductor device 200P is formed in and above the active layer 10C of the semiconducting substrate 10. An illustrative isolation structure 12, e.g., a shallow trench isolation structure, formed in the substrate 10 acts to electrically isolate the semiconductor device 200P from other devices formed on the substrate 10. In one illustrative embodiment, the semiconducting substrate 10 a silicon-on-insulator (SOI) substrate comprised of bulk silicon 10A, a buried insulation layer 10B (commonly referred to as a "BOX" layer) and an active layer 10C, which may also be a silicon material. Of course, the present invention is equally applicable to other configurations of the substrate 10. For example, the substrate 10 may be comprised of semiconducting materials other than silicon and/or it may be in another form, such as a bulk silicon configuration. Thus, the terms substrate or semiconductor substrate should be understood to cover all forms of semiconductor structures. The semiconductor device 200P also generally comprises a gate insulation layer 22, a layer of high-k (k greater than 10) insulating material 24 and a gate electrode structure 26.

The trench isolation structures 12, the gate insulation layer 22, the layer of high-k (k greater than 10) insulating material 24 and the gate electrode structure 26 may each be comprised of a variety of materials (including those described in the background section of this application) and they may each be manufactured using a variety of known techniques. For example, in some cases the gate electrode structure 26 may be comprised of a single material, like a silicided polysilicon in a "gate-first" approach, or a plurality of conductive materials, e.g., aluminum, titanium nitride, tantalum nitride, aluminum titanium, etc. in a high-k, metal gate, "gate-last" approach. Thus, the present invention should not be considered as limited to any particular configuration or materials of construction for the gate electrode structure 26, nor to the manner in which the gate electrode structure 26 is formed.

Also depicted in FIGS. 2A and 2B (enlarged view) is an illustrative work function adjusting layer 202 in accordance with one illustrative embodiment disclosed herein. The work function adjusting layer 202 generally has opposed ends 202A, 202B and a middle section 202M. As used herein, the middle section 202M of the work function adjusting layer 202 should be understood to be the middle third of the overall length of the work function adjusting layer 202 in the gate width direction 10W. The work function adjusting layer 202 also includes end regions 204 proximate at least the opposed ends 202A, 202B of the work function adjusting layer 202. In general, the end regions 204 have a greater thickness 204T than the thickness 206 of the work function adjusting layer 202 in the middle section 202M of the work function adjusting layer 202. In one illustrative embodiment, the end regions 204 have a maximum thickness 204T that is at least 25% thicker than the average thickness 206 of the work function adjusting layer 202 in the middle section 202M. The average thickness 206 of the middle section 202M may be determined based on a TEM micrograph of the work function adjusting layer 202 by taking three thickness readings that are determined from the micrograph: one at the approximate end of each end of the middle section 202M, and one at the approximate mid-point of the middle section 202M. In another particularly illustrative example, the end regions 204 have a maximum thickness 204T that is approximately 30-70 percent thicker than the average thickness 206 of the work function adjusting layer 202 in the middle section 202M. In one very specific example, the end regions 204 have a thickness 204T of approximately 8.5 nm, whereas the average thickness 206 of the work function adjusting layer 202 in the middle section 202M is approximately 5.2 nm. In another illustrative embodiment, the maximum thickness 204T of the end regions 204 is at least 3-5 nm thicker than the average thickness of the middle section 202M of the work-function adjusting layer 202M.

The end regions 204 of the work function adjusting layer 202 extend along the axial length of the work-function adjusting layer 202 toward the middle section 202M by a distance 204L, the magnitude of which may vary depending upon the application. Using current day technology, the distance 204L may be at least 10% of the overall length of the work function adjusting layer 202 (in the gate width direction 10W) and, in some cases, the distance 204L for each end region 204 may be approximate 30-40% of the overall length of the work function adjusting layer 202. Of course, the end regions 204 need not be symmetrical in terms of their size, shape, configuration and dimension although they may be, and the above noted examples will likely change as technology advances and gate widths decrease. Thus, the above noted examples should not be considered a limitation of the present invention. The end regions 204 include a region 202L that exhibits a relatively lower stress level as compared to an illustrative region 202H, which exhibits a relatively higher stress level. Importantly, in contrast to the illustrative prior art work function adjusting layers 32 depicted in FIGS. 1C and 1D, in the work function adjusting layer 202 disclosed herein, the region 202H of relatively higher stress levels tends to be more uniform, or at least have a minimum acceptable stress level, along most if not the entire gate width 10W of the device 200P. For example, the absolute stress level of the work function adjusting layer 202 disclosed herein may actually be higher proximate the ends 202A, 202B of the work function adjusting layer 202 than in the middle section 202M of the work function adjusting layer 202 due to the presence of the regions 204, although that may not be the case in all applications.

The work function adjusting layer 202 may be comprised of a variety of work function adjusting material, such as silicon germanium, gallium arsenide, any III-V compound, etc., and it may be formed by performing a variety of known techniques. In one illustrative embodiment, the work function adjusting layer 202 is a layer of silicon germanium (with a germanium concentration of approximately 30%) that is formed by performing a novel epitaxial deposition process 210, as schematically depicted in FIG. 2C.

In general, what is desired for a transistor is an increase in on-state current ($I_{on}$) for the same amount of off-state current ($I_{off}$). A PMOS transistor that includes the novel work-function adjusting layer 202 disclosed herein produces a higher on-state current, approximately 10% more, than transistors that have prior art work-function adjusting layers like those depicted in FIGS. 1C and 1D. This surprising and unexpected increase in the electrical performance characteristics of the PMOS transistor device 200 disclosed herein is only attributable to the incorporation of the structure of the novel work-function adjusting layer 202 described above.

The work function adjusting layer 202 described herein was manufactured using a novel process that will now be described. The process disclosed will be in connection with the manufacture of a work function adjusting layer 202 wherein the end regions 204 have a thickness 204T of approximately 8.5 nm and the average thickness 206 of the work function adjusting layer 202 in the middle section 202M is approximately 5.2 nm. In that particular example, the work function adjusting layer 202 comprised of silicon germanium (having a germanium concentration of approximately 30%) was deposited using an epitaxial deposition process in a vertical furnace with a hydrogen flow rate of 5-8 slm (standard liter per minute). The deposition process was performed at a temperature of approximately 465° C. for a duration of approximately 60 minutes. This novel deposition process is very different from the typical epitaxial deposition processes used to form the work function adjusting layers 32 depicted in FIGS. 1C and 1D. More specifically, those prior art work function adjusting layers 32 are typically manufactured using a significantly lower hydrogen flow rate of approximately 3.7 slm, at a temperature of approximately 465° C. for a duration of approximately 60 minutes.

As will be recognized by those skilled in the art after a complete reading of the present application, the novel methods disclosed herein may be employed in various processing schemes. For example, the illustrative methods disclosed herein may be employed in either a "gate-first" or a "gate-last" processing technique. The conductive gate electrode structures of the NMOS transistor and/or the PMOS transistor may be made of any conductive material, such as metal or polysilicon. Thus, the present invention should not be considered as limited to any illustrative process flow or details described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a semiconducting substrate;
   a work-function adjusting layer positioned at least partially in said semiconducting substrate; and
   a gate electrode positioned above said work-function adjusting layer, said work-function adjusting layer having an axial length that extends in a direction that corresponds to a gate width of said gate electrode, wherein said work-function adjusting layer comprises a middle section and opposing ends disposed along said axial length, and an end region located proximate each of said opposing ends, each of said end regions having a maximum thickness that is at least 25% greater than an average thickness of said middle section of said work-function adjusting layer.

2. The device of claim 1, wherein said semiconductor device is a PMOS transistor.

3. The device of claim 2, wherein said work-function adjusting layer is a layer of at least one of silicon germanium or gallium arsenide.

4. The device of claim 1, wherein each of said end regions extend along said axial length of said work-function adjusting layer by a distance that is equal to at least 10% of said axial length of said work function adjusting layer.

5. The device of claim 1, wherein said maximum thickness of said end regions is at least 3-5 nm greater than said average thickness of said middle section of said work-function adjusting layer.

6. The device of claim 1, wherein each of said end regions have the same configuration.

7. A semiconductor device, comprising:
a semiconducting substrate;
a work-function adjusting layer positioned at least partially in said semiconducting substrate; and
a gate electrode positioned above said work-function adjusting layer, said work-function adjusting layer having an axial length that extends in a direction that corresponds to a gate width of said gate electrode, wherein said work-function adjusting layer comprises a middle section and opposing ends disposed along said axial length, and an end region located proximate each of said opposing end, each of said end regions having a maximum thickness that is at least 30-70% greater than an average thickness of said middle section of said work-function adjusting layer.

8. The device of claim 7, wherein said semiconductor device is a PMOS transistor.

9. The device of claim 8, wherein said work-function adjusting layer is a layer of silicon germanium or gallium arsenide.

10. The device of claim 7, wherein each of said end regions extend along said axial length of said work-function adjusting layer by a distance that is equal to at least 10% of said axial length of said work function adjusting layer.

11. The device of claim 7, wherein said maximum thickness of each of said end regions is at least 3-5 nm greater than said average thickness of said middle section of said work-function adjusting layer.

12. A semiconductor device, comprising:
a semiconducting substrate;
a work-function adjusting layer comprised of silicon germanium positioned at least partially in said semiconducting substrate; and
a gate electrode positioned above said work-function adjusting layer, said work-function adjusting layer having an axial length that extends in a direction that corresponds to a gate width of said gate electrode, wherein said work-function adjusting layer comprises a middle section and opposing ends disposed along said axial length, and an end region located proximate each of said opposing ends, each of said end regions having a maximum thickness that is at least 3 nm greater than an average thickness of said middle section of said work-function adjusting layer and each of said end regions extend along an axial length of said work-function adjusting layer by a distance that is equal to at least 10% of said axial length; and
a gate electrode positioned above said work-function adjusting layer.

13. The device of claim 12, wherein said maximum thickness of said end regions is at least 3-5 nm greater than said average thickness of said middle section of said work-function adjusting layer.

14. The device of claim 12, wherein an upper surface of at least one of said end regions having said greater maximum thickness is raised relative to an upper surface of said middle section of said work-function adjusting layer.

15. The device of claim 1, wherein an upper surface of at least one of said end regions having said greater maximum thickness is raised relative to an upper surface of said middle section of said work-function adjusting layer.

16. The device of claim 7, wherein an upper surface of at least one of said end regions having said greater maximum thickness is raised relative to an upper surface of said middle section of said work-function adjusting layer.

\* \* \* \* \*